United States Patent
Schneider

(10) Patent No.: US 6,176,995 B1
(45) Date of Patent: Jan. 23, 2001

(54) METHOD AND APPARATUS FOR ELECTROLYTICALLY METALLIZING OR ETCHING MATERIAL

(75) Inventor: Reinhard Schneider, Cadolzburg (DE)

(73) Assignee: Atotech Deutschland GmbH, Berlin (DE)

( * ) Notice: Under 35 U.S.C. 154(b), the term of this patent shall be extended for 0 days.

(21) Appl. No.: 08/674,172

(22) PCT Filed: Jan. 30, 1995

(86) PCT No.: PCT/DE95/00134

§ 371 Date: Jul. 1, 1996

§ 102(e) Date: Jul. 1, 1996

(87) PCT Pub. No.: WO95/20692

PCT Pub. Date: Aug. 3, 1995

(30) Foreign Application Priority Data

Jan. 28, 1994 (DE) ................................. 44 02 596

(51) Int. Cl.⁷ ............................. C25D 5/06; C25D 17/14; C25D 21/00; C25F 3/00
(52) U.S. Cl. ..................... 205/125; 205/128; 205/133; 205/137; 205/145; 205/150; 205/152; 205/640; 205/686; 204/212; 204/224 R; 204/224 M; 204/275; 204/283; 204/284
(58) Field of Search ..................... 205/137, 138, 205/150, 152, 640, 686, 687, 125, 128, 133, 145; 204/212, 224 R, 224 M, 275, 283, 284

(56) References Cited

U.S. PATENT DOCUMENTS

| | | | |
|---|---|---|---|
| 2,540,602 | * 2/1951 | Thomas et al. | 204/15 |
| 2,725,353 | * 11/1955 | Strobel | 204/32 |
| 3,108,031 | * 10/1963 | Hasala et al. | 156/345 |
| 3,616,287 | * 10/1971 | Draghicescu et al. | 204/25 |
| 4,105,526 | * 8/1978 | Lewellen, Jr. et al. | 204/213 |
| 4,661,213 | * 4/1987 | Dorsett et al. | 204/15 |
| 5,167,779 | * 12/1992 | Henig | 204/140 |

* cited by examiner

Primary Examiner—Donald R. Valentine
(74) Attorney, Agent, or Firm—Paul & Paul

(57) ABSTRACT

The current density with which the process is used is of essential importance for the economy of a method of electrolytically treating materials. Normally only low or medium current densities are used, as the speed of replacement of consumed materials in the direct vicinity of the surface of the material for treatment has a restrictive effect on the magnitude of the current density at which a usable process result can still be achieved. However, a low current density leads to long electrolysis times and to complex treatment installations.

Figure 1:
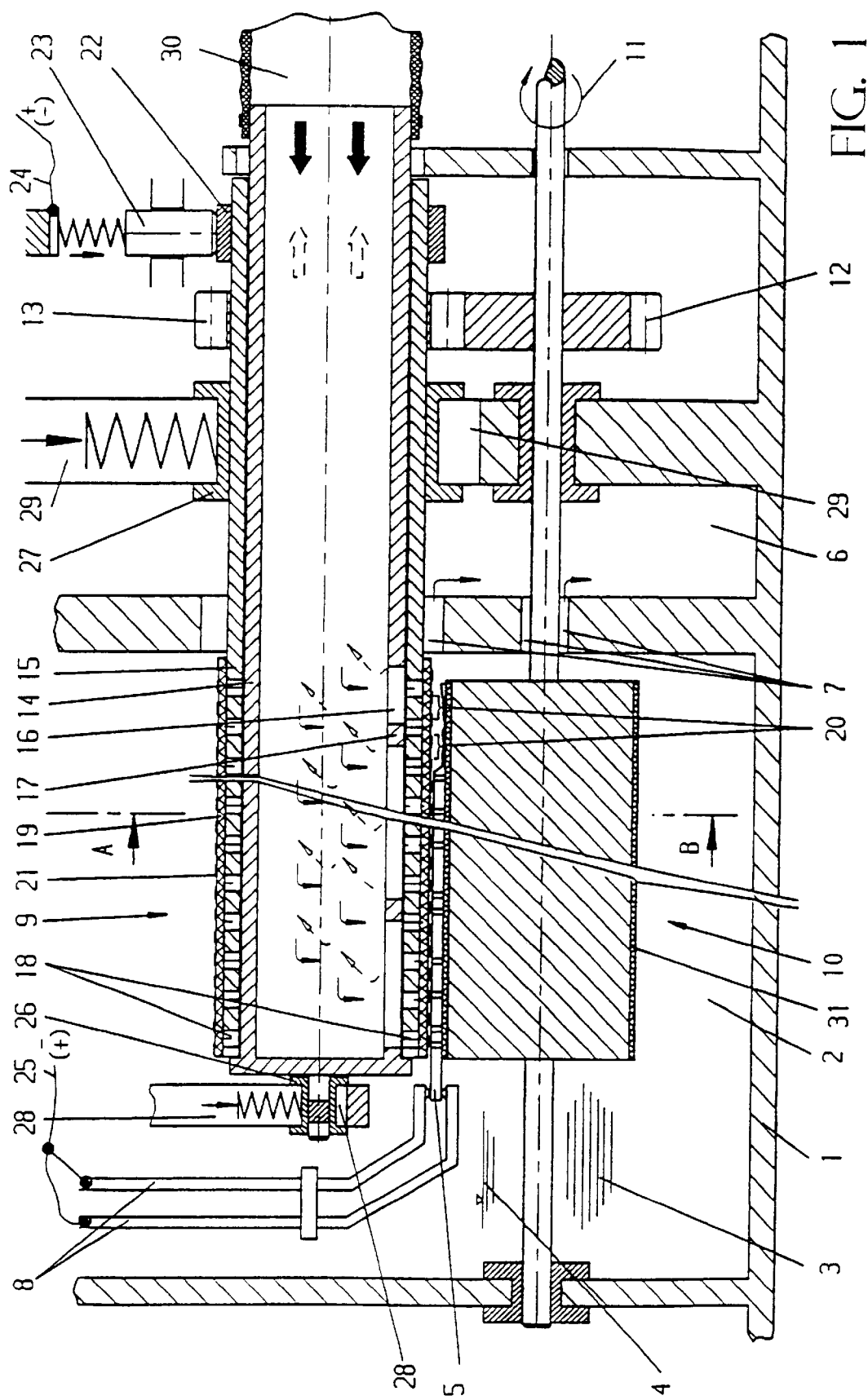

The opportunity afforded according to the invention of improving the transfer of materials at the surface of the material for treatment consists in generating a large flow of electrolyte at the treatment point by means of rotating electrodes which are movable synchronously with the surfaces of the material for treatment, and which may be electrically polarized with respect to the material for treatment, out of which the treatment agent emerges through openings, or into which it is sucked through openings.

34 Claims, 11 Drawing Sheets

METHOD AND APPARATUS FOR ELECTROLYTICALLY METALLIZING OR ETCHING MATERIAL

This application is a national stage application of Application No. PCT/DE95 00134, filed Jan. 30, 1995, which is based on German Patent Application No. P 44 025 96.3-42 filed Jan. 28, 1994.

BACKGROUND OF THE INVENTION

The invention relates to a method of electrolytically metallising or etching material.

The economic operation of electrolytic metallising and etching methods essentially depends on the maximum current density at which an industrially useful treatment result may still be obtained. The maximum current density is above all dependent on the speed at which fresh treatment agent (electrolyte solution) can reach the surface of the material to be treated. During electrolytic metallisation, the precipitated metal ions are consumed in the direct vicinity of the material for treatment. This reduces the metallising speed, and the process decelerates. The same also applies to other electrolytic treatment methods, for example electrolytic etching.

In order to provide assistance here, flesh treatment solution can be supplied continuously trough flow tubes which in electrolytic metallisation are disposed between the anode and the material for treatment (cathode), on to the surface of the material for treatment. This procedure however is subject to certain fluidic limits; the exchange of liquid in the direct vicinity of the surface of the material for treatment (diffusion layer) may only be increased to a restricted degree. Apart from this, such a procedure is disadvantageous, as the flow tubes disposed between the anodes and the material for treatment screen the electrical field between the anodes and cathodes, so that metal is irregularly deposited on the material. This disadvantage is particularly serious when the space between the flow tubes and the surface of the material is small. On the other hand, for fluidic reasons a small space between the flow tubes and the material surface would be preferable, in order to achieve controlled flow direction and the highest possible current density. In this case high current densities would occur at some points on the surface of the material, so that the additives conventionally included in electrolytic metallising baths would become oxidised.

Plate-shaped material for treatment, particularly printed circuit boards, is preferably processed in horizontal treatment installations.

The material is grasped in a horizontal position and passed through the installation in a horizontal direction, thus being electrolytically treated. In such installations, rollers are normally used for transporting and guiding the material. These also are located in the area between anode and cathode. Particularly in the case of extremely thin films, guide members are also necessary in order to transport them efficiently, in order to prevent the films from slipping off the transport track and becoming wound around the transport rollers. Such constructional members, like the transport rollers mentioned, also hinder the current flow between the anode and the material for treatment.

Soluble anodes, produced from the metal to be precipitated, are normally used for electrolytic metallisation. Their positioning inside the metallising installation and their normal shape and size give rise to considerable difficulties in finding simple constructive solution to the named problems. When using insoluble anodes, there is on the other hand the possibility in horizontal installations of making these in a longitudinally-extended form, and of disposing them in such a way that the screening actions described do not occur. For example, in such arrangements, in repeated sequences of adjacent insoluble anodes, at least one flow tube may be disposed for supplying fresh treatment agent to the surface of the material, and to transport rollers. The positioning of these individual members is so selected that the material s moved slowly past them during the metallising process. The length of such an installation is determined by the geometrical dimensions of the three members, their necessary spacing apart from one another, and by their overall number. Such treatment installations are therefore extremely long and relatively expensive.

DESCRIPTION OF THE PRIOR ART

In the German Disclosure Document 36 03 856 there is described a method for continuously electroplating flat workpieces such as printed circuit boards, in which the workpieces are passed horizontally through an electroplating installation, and are grasped and transported inside the electroplating installation by a cathodically-incorporated rotating pair of rollers, and in which the electrolyte solution is transferred on to the workpiece from a likewise rotating pair of rollers, located in the vicinity of the cathodic roller pair, and incorporated as anode, the surface of the said anodic pair of rollers being capable of absorbing liquid and rotating at a narrow interval from the surface of the workpiece, so that the electrochemical deposition of metal is effected in the gap between workpiece surface and the surface of the anodic roller pair. In this case the electrolyte solution is sprayed from spray heads over the anodic rollers, so that the surface of the material for treatment is permanently supplied with enriched electrolyte solution. By means of the rapid rotation of the rollers, the solution however is centrifuged in all directions, and caught by the plastics screens located above the spray heads and the anode rollers. Large quantities of the electrolyte solution are indeed transported into the working area. However, only a small proportion thereof reaches the locus of the treatment point having the largest current density. This point lies between the anode roller and the surface of the material. Controlled direction of flow at this point is not possible.

In the case of roller-shaped anodes, the greatest current density occurs in the vicinity of the surface line of the anode lying closest to the material for treatment. Vertically on either side of the surface line, it reduces sharply. This leads to a situation in which the electroplating speed, seen in the direction of the transport path, fluctuates intensely. In order to obtain a sufficient medial current density over the entire treatment path, therefore, the maximum current density beneath the surface line of the anode must be high. This demands a controlled and effective exchange of electrolyte at the diffusion layer at that point; this cannot be realised by the abovenamed method.

A further disadvantage in this case is that, at the point of highest current density, gases such as hydrogen, oxygen and chlorine are formed. These gases attack the anode material. Therefore this material must be provided with coatings of noble metal in order to restrict their corrosion. In addition, the gases have to be removed by an additional flow of electrolyte solution over the anodes. This requires further technical outlay on the installation.

In the publication EP 0 210 072 A1 there is described an apparatus with a rotating metallising brush for selectively metallising metal parts, and in which a roller-shaped anode surrounded by a porous hydrophobic material serves as a counter-electrode for the metal pats to be coated, the metal parts being slidingly moved along the surface line of the anode, electrolyte solution being caused to flow from the interior of the anode through the hydrophobic material on to the metal parts.

In the essay "Elektrolytische Hochleistungsverzinkung von Stahlband durch mechanische Grenzschichtbeeinflussung" (Electrolytic High-performance Galvanisation of Steel Strip by Mechanical Influence on the Boundary Layer) by B. Meuthen and D. Wolfhard in the specialist periodical "Metalloberfläche", vol. 36 (1982) pages 70–75, there is described a method for high-performance galvanisation of steel strip. The laboratory installation illustrated comprises a cathodically-incorporated circular sheet metal disc which is passed in a rotating fashion along a perforated anode, fibre fleece attached to the anode being wiped on its surface during rotation of the cathode. Fresh electrolyte solution is continuously passed on to the cathodic metal disc by the anode.

The abovementioned documents disclose methods and apparatus in which the surface of the material for treatment is wiped in order continuously to supply it with fresh electrolyte solution, keeping the diffusion layer as thin as possible. It becomes apparent however that the surface of the material for treatment may easily be damaged by wiping. Damage is only avoided by the use of extremely soft materials as a covering on the wiper electrodes. On the other hand, the soft covering is subject to intensified wear, particularly in the case of plate-shaped workpieces having holes which have sharp edges, so that microfine worn-off particles pass into the electrolyte solution. The particles are again transported via the electrolyte circuit on to the material to be treated, and cause problems at that point. These can hinder metal deposition, particularly in small holes in printed circuit boards, as they aggregate at that point. It has become apparent that the resulting quality problems cannot be resolved even by expensive additional filter systems.

SUMMARY OF THE INVENTION

The problem underlying the present invention is therefore to find a method and an apparatus for electrolytically metallising or etching material for treatment at a high current density, in which the named disadvantages of prior art do not appear.

According to the invention, an electrolytic treatment method with high current density, which may be carried out in a cost-effective manner, in that:

the material for treatment and electrodes are brought into contact with a treatment agent, and the electrodes are electrically polarised with respect to the material;

the material is moved linearly, and the electrodes rotarily, and treatment agent is supplied to the partly hollow electrodes;

the treatment agent is conveyed out of, or sucked into, openings in the electrodes lying opposite the surfaces of the material for treatment, and the speed and direction of rotation of the electrodes is so adjusted that the outer sides of the electrodes are moved synchronously with the surfaces of the material for treatment.

BRIEF DESCRIPTION OF THE DRAWING FIGURES

Figure 2:
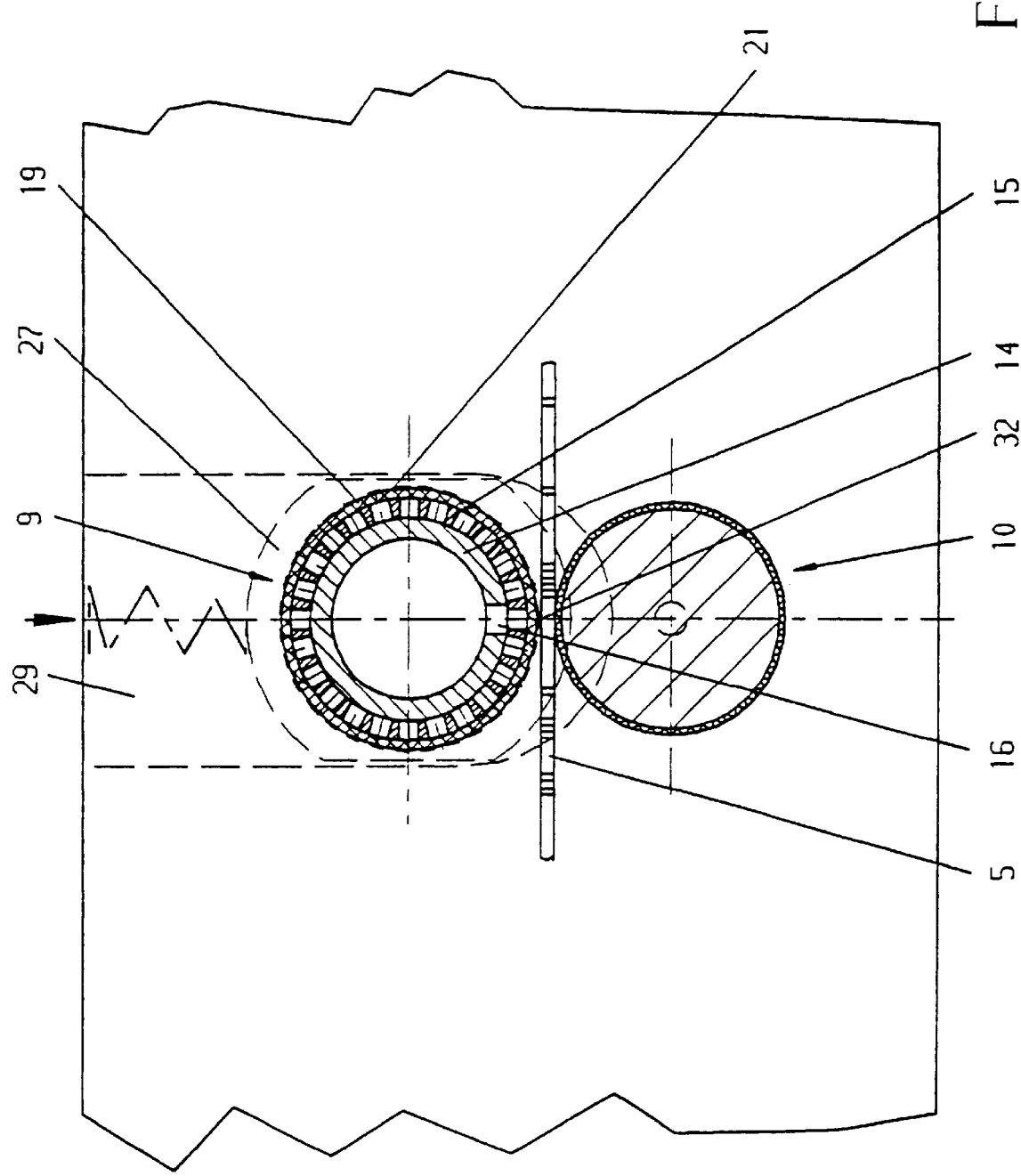
Figure 3:
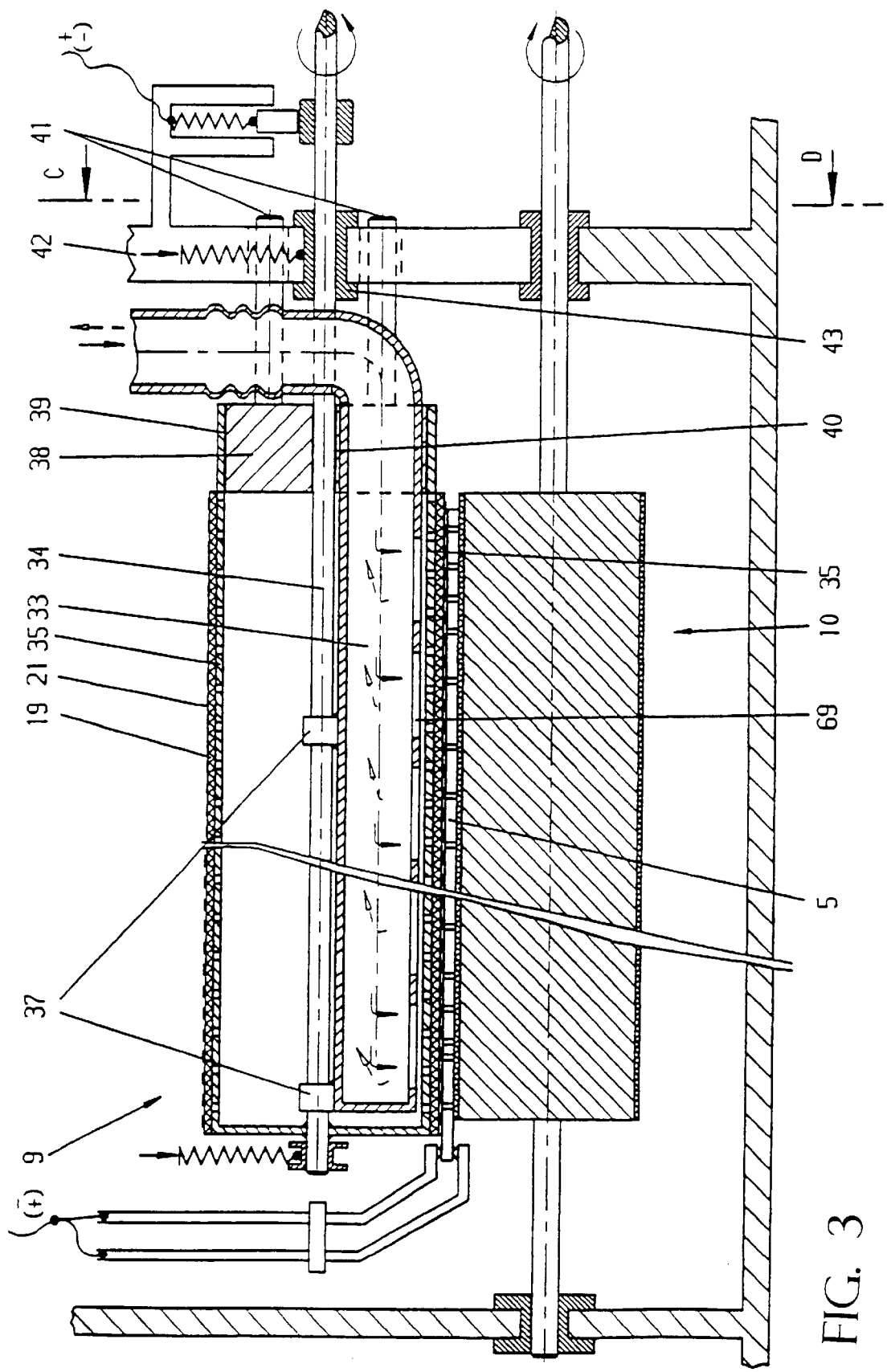
Figure 4:
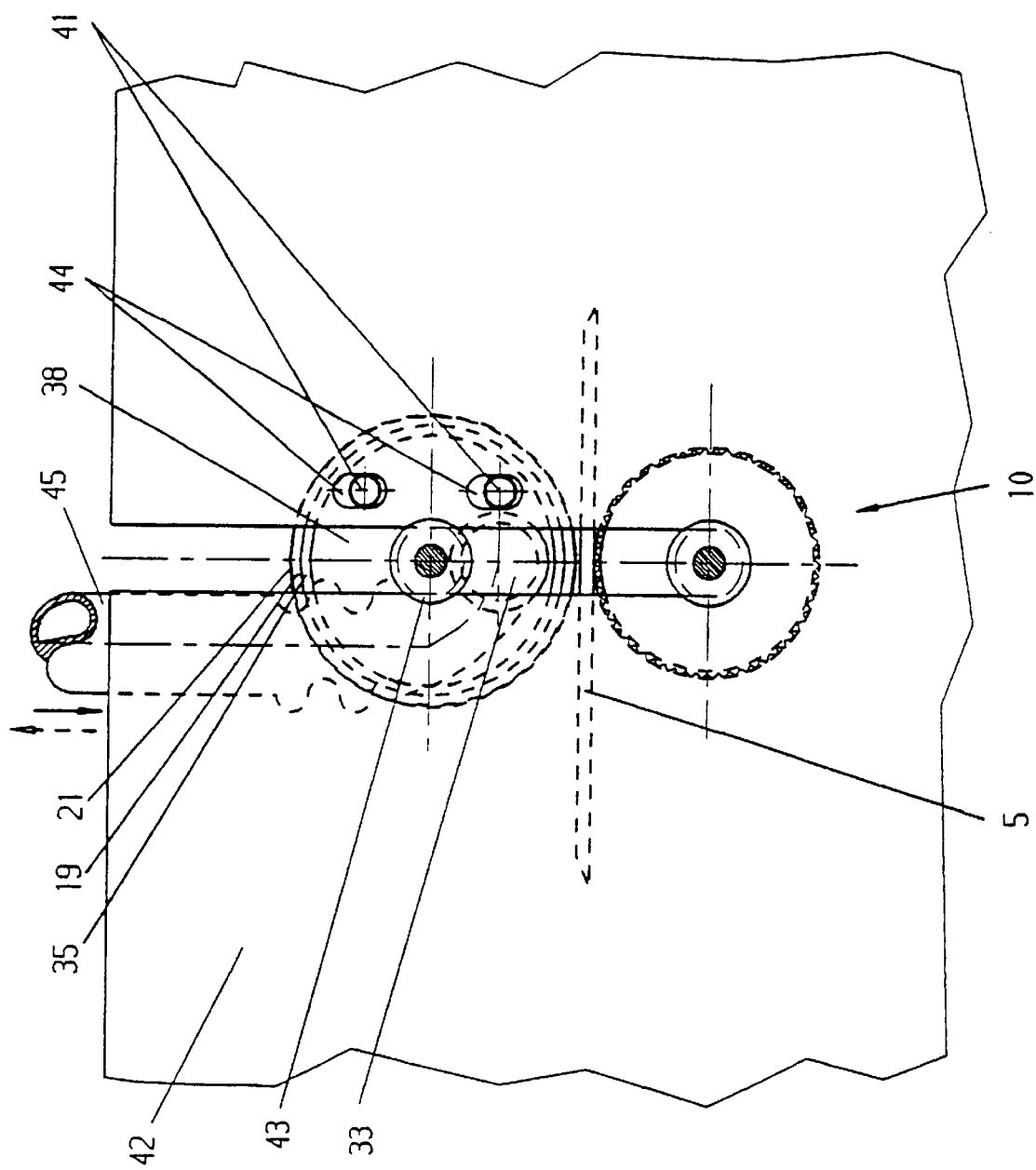
Figure 5:
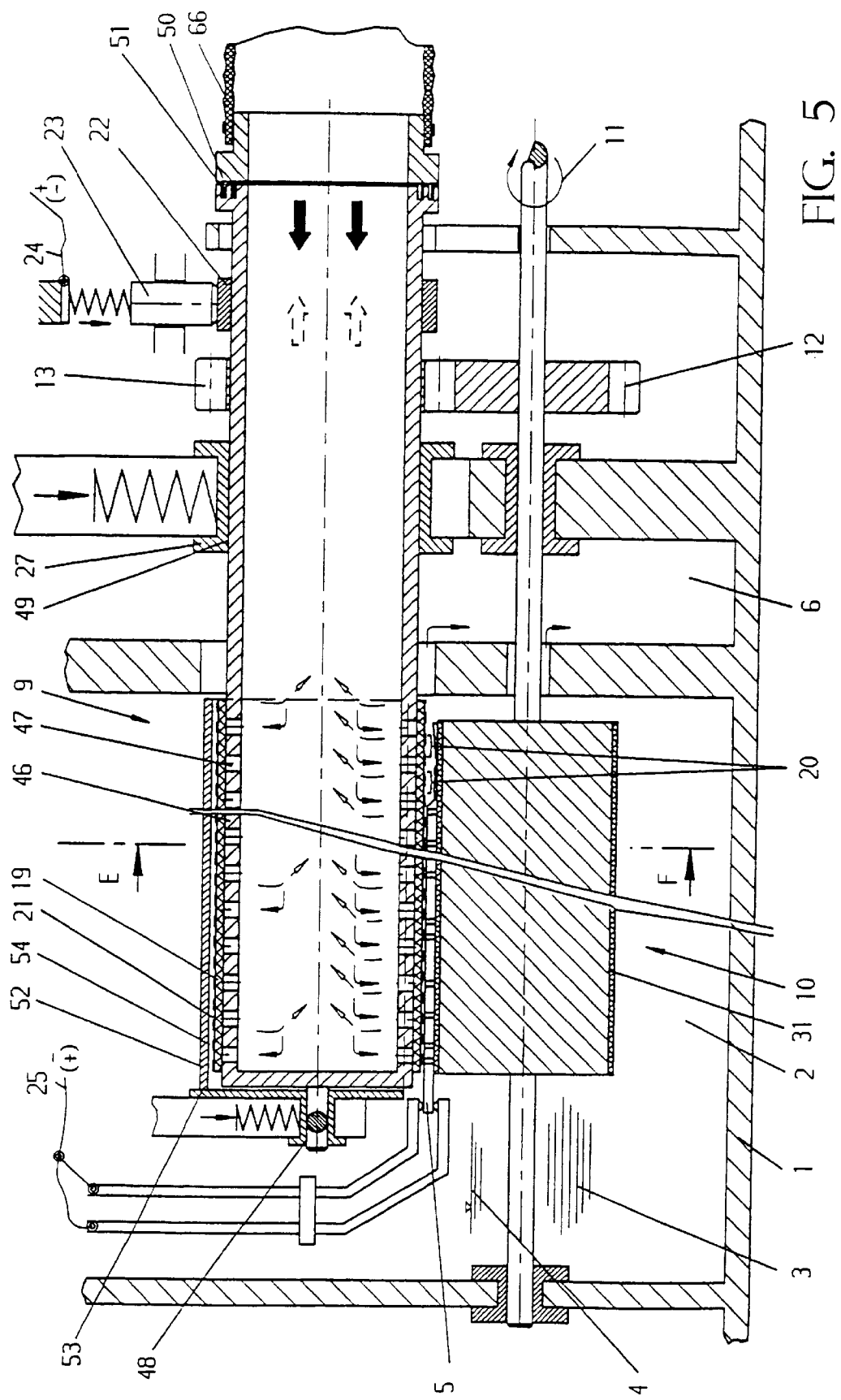
Figure 6:
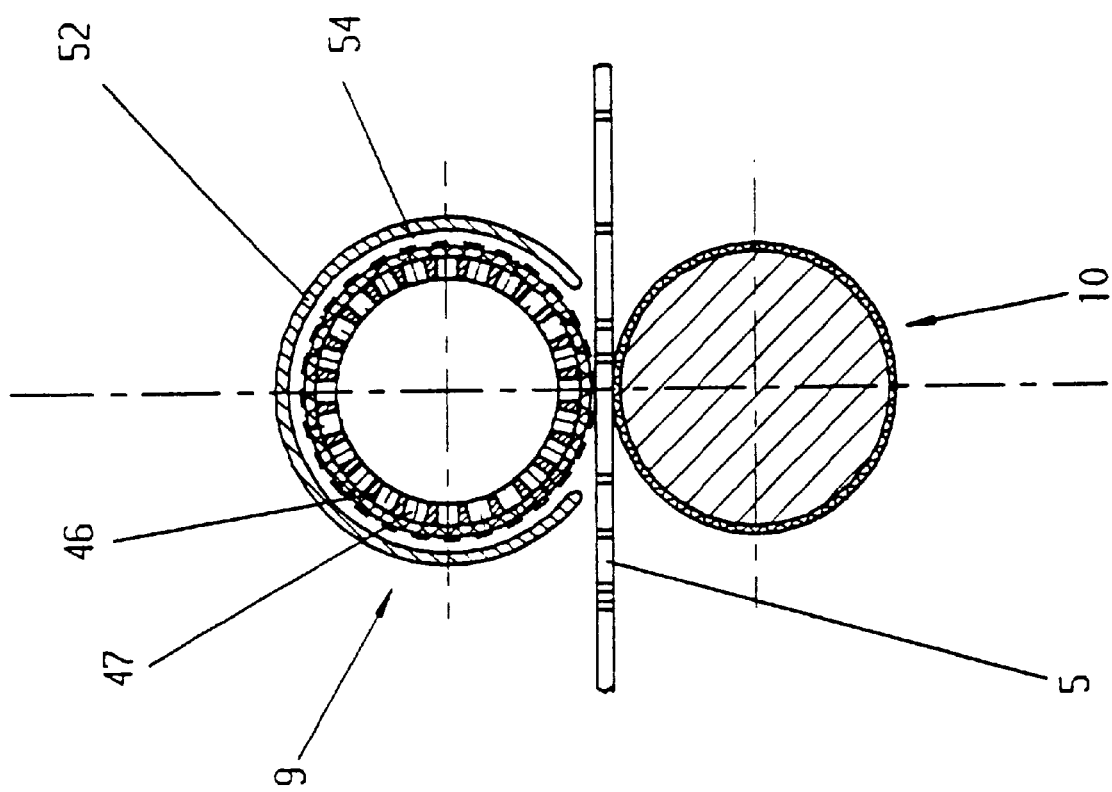
Figure 7:
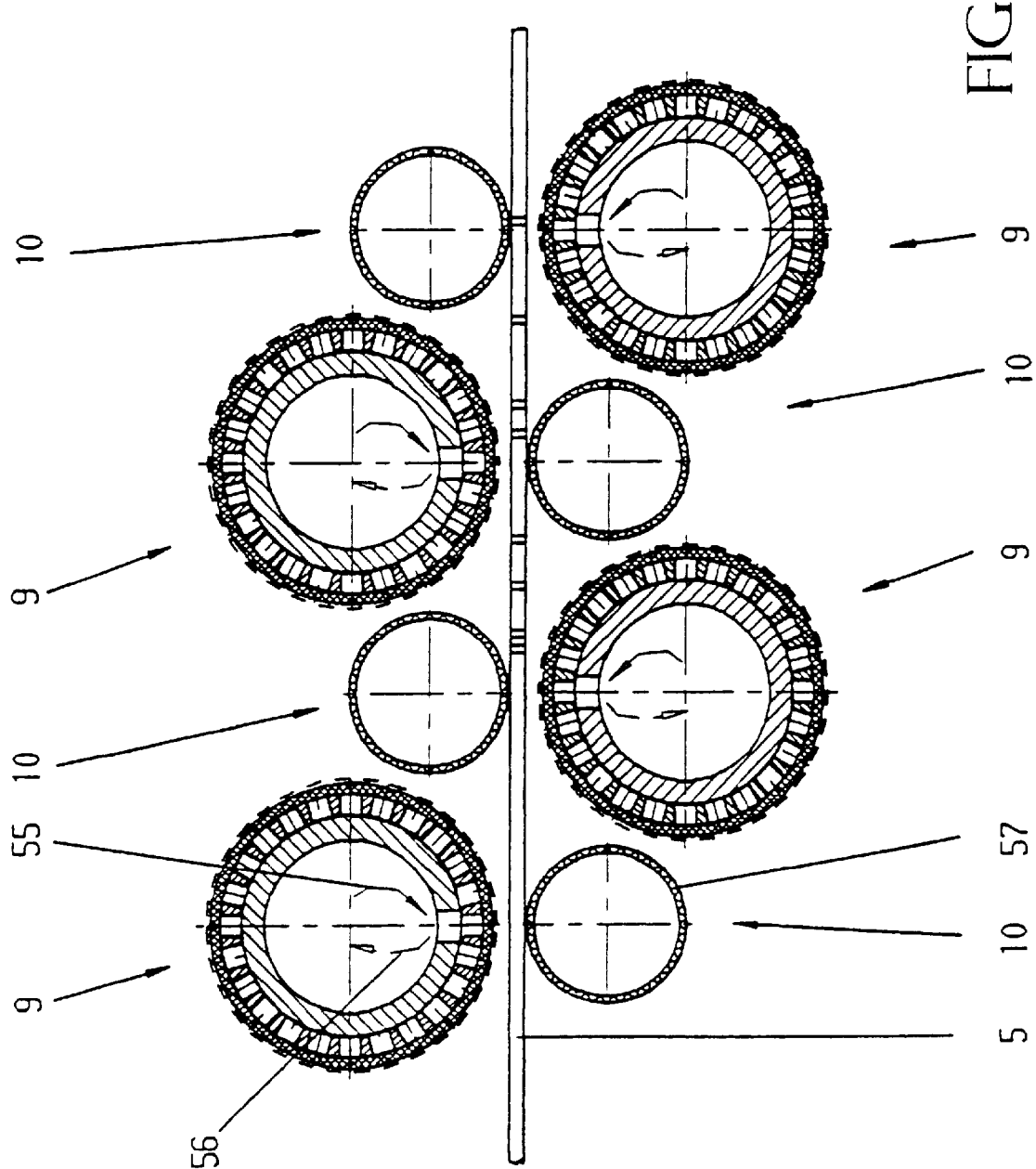
Figure 8:
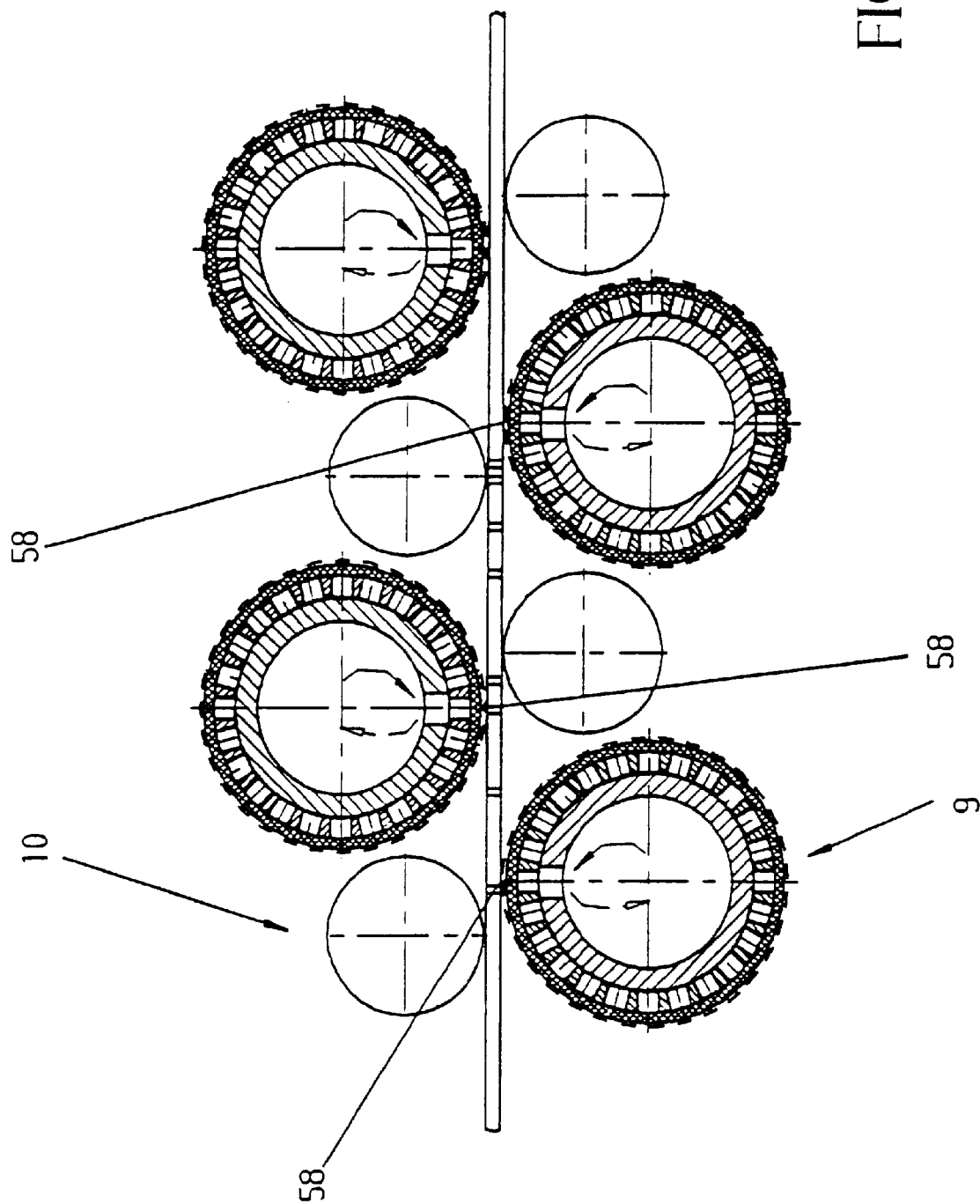
Figure 9:
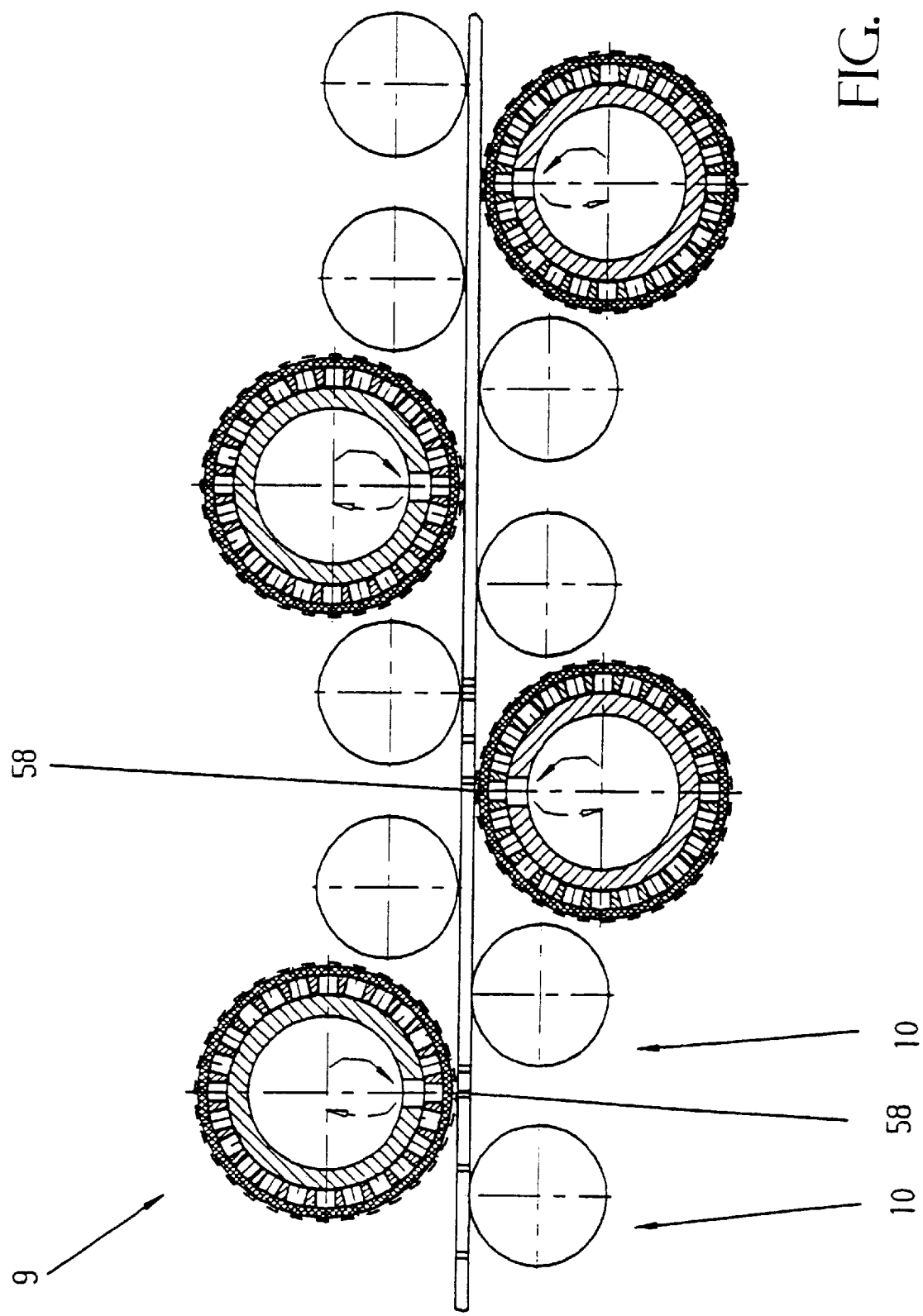
Figure 10:
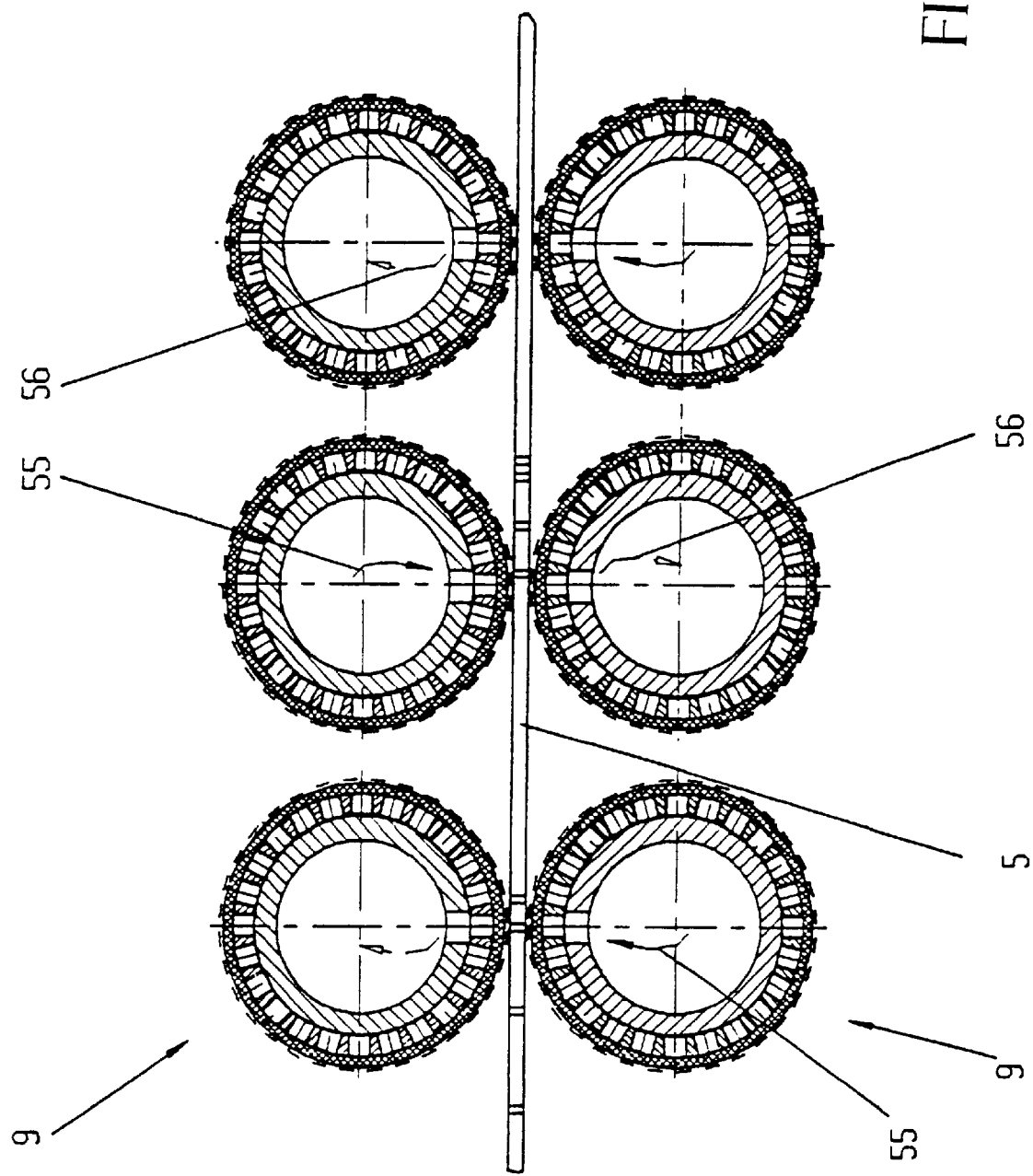
Figure 11:
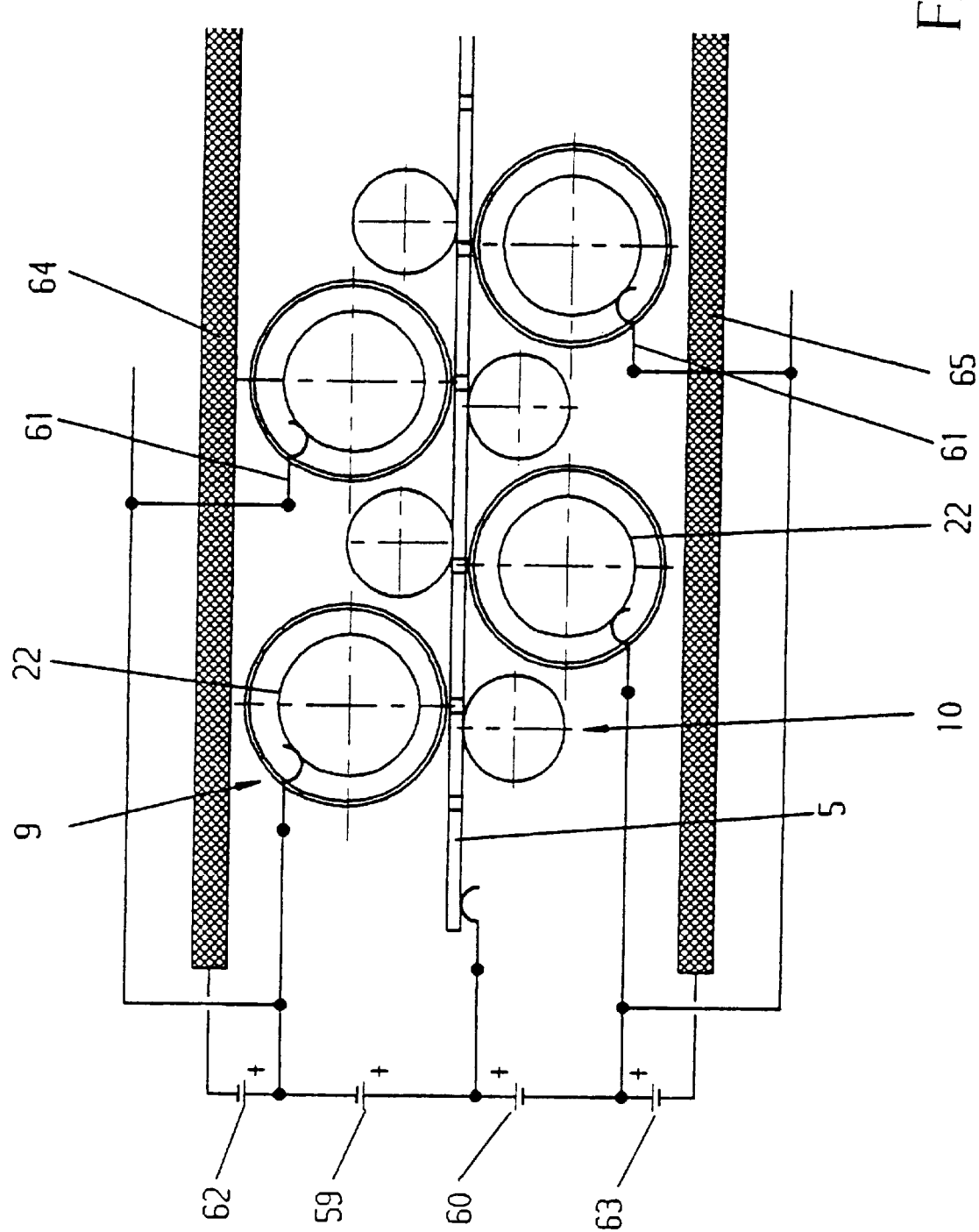

FIG. 1: a longitudinal section through a flow electrode with an axially-disposed electrolyte tube;

FIG. 2: a cross-section through the flow electrode in FIG. 1;

FIG. 3: a longitudinal section through a flow electrode with a non-axial electrolyte tube;

FIG. 4: a cross-section through the flow electrode in FIG. 3;

FIG. 5: a longitudinal section through a one-piece flow electrode;

FIG. 6: a cross-section through the flow electrode in FIG. 5;

FIG. 7: an arrangement of electrodes and counter-rollers along the transport track of the material for treatment;

FIG. 8: an arrangement of electrodes and counter-rollers offset thereto, along the transport track of the material for treatment;

FIG. 9: an arrangement of pairs of electrodes and counter-rollers along the transport track of the material for treatment;

FIG. 10: an arrangement of flow electrodes and suction electrodes offset thereto, along the transport track of the material for treatment;

FIG. 11: an electrical circuit arrangement for an electrolytic etching installation.

DESCRIPTIONS OF THE PREFERRED EMBODIMENTS

By virtue of the fact that the electrodes are polarised with respect to the material for treatment, and therefore serve to generate the electrical field necessary for the electrolytic treatment, and on the other hand undertake the additional task of continuously supplying fresh treatment agent to the surface of the material, an extremely simple configuration of the installation is possible.

If electrode materials with a lower degree of electrical conductivity are used, such for example as special steel, high losses are normally to be expected due to the high current densities, so that the metallic parts can heat up rapidly. Due to the rotation of the electrodes, and to the intensive circulation of the treatment agent in the direct vicinity of the electrodes, the resultant heat is however distributed over the entire electrode, and is thus rapidly passed off into the electrolyte solution.

Damage to the surface of the material, such as occurs in the known wiping methods, is not possible, as the speed and direction of rotation of the electrodes is so adjusted that the outer sides of the electrodes are moved synchronously with the surfaces of the material for treatment.

By causing the treatment agent to flow at high speed over the surface of the material, the resultant gases, such for example as hydrogen, oxygen and chlorine, are rapidly dispersed.

In a preferred embodiment of the invention, the electrodes also undertake the task of transporting and guiding the material through the treatment installation, being brought into direct contact with the surfaces of the material for treatment. In this way it is possible to transport the material through the installation by means of the rotated electrodes.

By means of the measures mentioned, it is possible to produce an extremely short and compact apparatus, as a plurality of electrodes, generating the flow of current, can be disposed directly adjacent to one another and lying directly opposite the material for treatment. It is not necessary, as in installations of a previous type, to dispose the electrodes lying opposite the material at a large distance from one another, in order to provide guidance and transport devices, and if necessary flow devices, therebetween. This also means that the current density at the surface of the material fluctuates only to a small degree, and does not drop to values near zero between the electrodes.

This arrangement also offers the advantage that no apparatus for transporting, guiding or providing flow on the material, which could screen the field lines between anode and cathode, need be disposed between the electrodes and the material.

In a preferred embodiment, the treatment agent is conveyed almost vertically towards the surfaces of the material. Thus the treatment agent reaches the precise point at which the current density on the material surface is highest, so that at this point, with the greatest conversion of matter, an effective renewal of the consumed treatment agent takes place. In addition, the thickness of the diffusion layer is in this way reduced, so that the conveyance of fresh treatment agent on to the surface of the material is likewise improved. If material for treatment is used which contains holes, such for example as printed circuit boards, both the outer sides of the printed circuit boards and the walls of the holes are permanently supplied with fresh treatment agent. Due to the vertical provision of flow on the material, the treatment agent is also passed through the holes under pressure, so that even in the case of fine holes an effective liquid penetration is possible.

The treatment agent may in one alternative be conveyed on to the surfaces of the material for treatment by conveying the treatment agent out of openings in the hollow electrodes. Another possible way is to introduce the treatment agent into the openings in the electrodes by suction, so that it is conveyed at high speed out of the surrounding space to the points lying opposite the suction openings on the surface of the material. In this case the material for treatment and a suction electrode must be located inside the treatment agent, as otherwise it would not be possible to cause an effective flow at the treatment point.

A combination of electrodes out of which treatment agent is conveyed from suitable openings on to the surface of the material (flow electrodes), and further electrodes into which the treatment agent is sucked in through suitable openings (suction electrodes), is a further preferred embodiment of the invention. For example, penetration of the holes in the material may be forced, by causing a flow by means of flow electrodes disposed on one side of the material, and suction extraction of the treatment agent, which has passed through the holes in the material, by means of suction electrodes disposed on the other side of the material and lying opposite the flow electrodes. By means of such an arrangement, even the finest holes may be effectively penetrated by fresh treatment agent.

In a preferred embodiment of the invention, the material for treatment is grasped in a horizontal position and is transported in a horizontal direction. Horizontal installations suitable for this purpose are used in particular to treat printed circuit boards.

The electrodes may be used both to metallise the material for treatment and also to etch, preferably to demetallise such material. A combination of both procedures is also possible. For example, in metallising installations, the material may be moved past a plurality of electrodes disposed in sequence in the direction of transport and alternately incorporated anodically or cathodically with respect to the material, so that the material is respectively metallised and partly demetallised again. So that the material is provided with a metallic layer at the end of the transport path, it is naturally necessary to adjust the treatment conditions in such a way that the quantity of precipitated metal is greater than the quantity of metal removed again in the demetallising procedure.

An apparatus suitable for carrying out the method according to the invention includes, in addition to the electrodes polarisable as anodes or cathodes with respect to the material for treatment, a means of supply of current for the electrodes and the material, and a rotary drive means for the electrodes. Also provided are means for supplying treatment agent to the flow electrodes, and suitable openings in the flow electrodes, out of which the treatment agent flows, or means of supplying treatment agent to the surfaces of the material for treatment, and further means for extraction by suction of the treatment agent through openings in the suction electrodes. The apparatus also comprises means for linear movement of the material and of the electrodes relative to one another, and a storage container for the treatment agent. According to the invention, means are provided for adjusting the speed and direction of rotation of the electrodes in such a way that the outer sides of the electrodes may be moved synchronously with respect to the surfaces of the material for treatment, i.e. no "wiping" relative movement occurs.

According to a preferred embodiment of the invention, the electrodes are in such form that they grasp the material for treatment in a horizontal position, and transport it in a horizontal direction in the treatment installation. Particularly suitable are longitudinally-extended electrodes disposed transversely to the direction of the path of movement of the material, and which are preferably roller-shaped.

In addition to a current supply and a rotary drive means, the electrode has a rotatably mounted external electrode tube with openings for feed or return of the treatment agent. The openings in the electrode tube are provided over the entire circumference. The electrode tube serves as a preferably insoluble anode or cathode, and at the same time as a transport and guide roller for the material for treatment, when the electrode is in direct contact with the material. The electrode tube is rotated by a rotary drive means and transports the material through the installation.

In order to insulate the electrode tube from the surfaces of the material, liquid- and ion-permeable, electrically non-conductive spacer means are provided on the outer sides of the electrodes. Between these and the electrode tube, in a further preferred embodiment of the invention, there are attached closely-fitting metallic or textile structures or grids, which surround said electrode tube on all sides. These serve to spread the jet of treatment agent emerging from the openings in the electrode tube, or to suck the treatment agent from a larger area on the surface of the material into the interior of the electrodes.

Provided in the electrode tube is a non-rotatable electrolyte tube in which, in one embodiment of the invention, openings are located only on the surface line opposite the surface of the material for treatment. In this way a directed flow can be passed on to the surface of the material. The electrolyte tube is connected to a flexible pipe for feed or return of the treatment agent to or from the treatment agent circuit and the storage container for the treatment agent. In a further embodiment of the invention, no electrolyte tube is provided in the electrode tube. In order in this case to obtain a directed flow at the point on the surface of the material directly opposite the electrode, a shell-shaped covering is provided above the electrode tube, which is open to the outside only opposite the surface of the material. There is a gap between the covering and the electrode tube.

In order to be able simultaneously to process both sides of a plate-shaped material for treatment, electrodes are disposed on both sides. If the electrodes formed according to the invention are involved here, both surfaces may be treated simultaneously by the method according to the invention. It is sufficient if only the electrodes on one side of the material are provided with a rotary drive means, while the electrodes opposite on the other side of the material do not have their own drive means, but merely absorb the pressure of the transport electrodes and are entrained by frictional contact with the moving material for treatment. Both on one side and on the other side of the material, the electrodes may be disposed in a close sequence adjacent to one another, so that only short treatment paths are necessary for a predetermined treatment scope (for example layer thickness of the precipitated metallic layer, etching depth). The spaces between two successive electrodes may be reduced to a small insulating intermediate space.

In the case of a horizontal installation for treating printed circuit boards, roller-shaped electrodes are disposed on both sides of the material. On one side, preferably the lower side, the electrode and counter-rollers are caused to rotate via a drive means, while counter-rollers and electrodes located or the upper side of the material are caused to rotate by the material for treatment.

The material passes through the installation between the lower and upper rollers. The electrodes disposed on one side may lie directly opposite those on the other side, or may be offset thereto. For example, each driven electrode may have lying opposite it a non-driven electrode of the same size, or two electrodes with a smaller diameter may be offset to the upper one. A non-driven electrode may also be offset to a driven electrode of the same size. In the latter two cases, the holes in the material for treatment are kept open beneath or above the flow electrodes, in order to improve the penetration of liquid.

A particularly preferable embodiment results when flow electrodes are provided on one side of the material, and suction electrodes, lying opposite the latter, are disposed on the other side of the material. This has the advantage that the treatment agent is passed effectively even through the finest holes in the material for treatment. In this case no further transport means is necessary on the side of the material opposite the driven electrodes. All the configurations described are also possible with suitable counter-rollers disposed on the side of the material opposite the flow or suction electrodes, said counter-rollers not being in the form of flow or suction electrodes.

In further embodiments, some of the rollers may be used purely for transport and provision of flow on the material for treatment, without being connected to the current supply. These rollers may be of an electrically non-conductive structure. Particularly for thin conductor films, whose transport and guidance through the treatment installation usually presents problems, a combination of flow and suction electrodes may be provided together with transport and flow rollers not connected to the current supply, the flow and suction electrodes being alternately opposite one another and being disposed on both sides of the material for treatment.

The invention is illustrated in greater detail by way of examples of apparatus according to the invention, with reference to the diagrammatic FIGS. 1 to 11.

In the Figures, a printed circuit board provided with holes is illustrated as a material for treatment.

FIG. 1 shows a flow electrode 9 in direct contact with the material for treatment 5, and a counter-roller 10, opposite said electrode 9, and not serving to supply treatment agent to the surface of the material or to provide current. This arrangement for example may be incorporated in a horizontal continuous-flow installation. In order to simplify the illustration, the working area in which the printed circuit board is located, is shown in abbreviated form.

The housing of the continuous-flow installation is indicated by 1. In the working container 2 there is a liquid treatment agent 3, for example a metallising or etching solution. When a flow electrode is used, the level 4 of the liquid treatment agent can be below the plane of the material for treatment. If on the other hand suction electrodes are used, the level of the treatment agent must be at such a height that it is above in the suction opening or the material, so that intake of air is avoided. The space 6 serves as an overflow compartment for the liquid treatment agent. Therefore no complex seals preventing the outflow of liquid are necessary in this area (openings 7).

The material for treatment is grasped laterally by a plurality of clamps 8 and provided with electrical contact. A plurality of clamps are distributed long the transport track, vertically to the plane of the drawing. The clamps move in the direction of the transport path at a speed which is at the same time the transport speed for the material.

The circumferential speed of the flow electrode and of its counter-roller are equal, so that they roll along the material for treatment. Slippage is avoided between the surface of the material and the roller surfaces. In this way damage to the surface cannot occur. Identical speeds for the individual arrangements are achieved by synchronisation of the drive system 11, not shown in detail, of the counter-roller, with the drive system for the clamps, and by transmission of the rotation of the counter-rollers via the gearwheels 12 and 13 to the flow electrode. The transmission ratio of the gearwheels is adapted to the diameters of the flow electrode and of the counter-roller. Particularly in the case of counter-rollers with smaller diameters, the drive system 11 for the rollers may also act on the gearwheel 13, and be transmitted from this point to the gearwheel 12.

The flow electrode comprises the electrolyte tube 14, which is secured in its mount against rotation, and a rotating electrode tube 15. The electrolyte tube has, on the surface line facing the material for treatment, openings 16. These may be slots, separated from one another by webs 17. Holes are also suitable. Electrolyte flows through these openings out of the electrolyte tube to the treatment point on the surface of the material. In the case of a suction electrode, the liquid treatment agent flows from the treatment point into the electrolyte tube.

The quantity of exchangeable treatment agent and its flow speed can be altered within wide limits by the size of the openings 16, and by the pump pressure in the circuit of treatment agent. The high treatment agent speeds necessary for the application of high current densities are thus easily achievable.

A sufficient quantity of fresh treatment agent can be supplied to the point on the surface of the material at which the greatest current density is found. An advantage is that the treatment agent is supplied almost vertically on to the flat surface of the material for treatment, so that the holes in the material are penetrated by a flow of fresh treatment agent.

The electrode tube 15 is rotatably mounted on the electrolyte tube 14. The preferably metallic electrode tube is provided, at least in the working area, over its entire circumference with apertures 18. Therefore treatment agent flows through each of the apertures, which are located precisely in front of the openings 16 in the electrolyte tube, to the material for treatment, or is sucked by the latter into the electrode. This flow of liquid may be passed through a metallic or textile structure or covering or sleeve 19 through the electrode tube also into the surface areas 20, which are located not directly in front of the apertures 18. The covering 19 also generates a uniformly electrically conductive electrode surface, and equalises the irregular electrical field line distribution of the electrode surface provided with apertures with the surface of the material for treatment, as the diameter of the apertures 18 is considerably larger than the mesh width of the structure 19. This is particularly important, is the material, as in the arrangement shown, if disposed at a very small interval from the electrically conductive electrode surface, and is being electrolytically treated with high current densities. The treatment agent is also uniformly distributed in the region of the treatment point by the rotation of the electrode tube, together with the weave structure located above it.

In order to avoid a short-circuit between the electrode and the surface of the material for treatment, an insulating means 21 is provided on the electrode surface. As this latter does not only partly cover the electrode surface, it must be liquid- and ion-permeable. For example, ceramic particles may be applied by plasma coating to the outermost raised portions of the weave structure 19. These are extremely thin, adherent and abrasion-resistant, leading to a long life duration. This additional covering is in direct contact with the surface of the material for treatment. Thus direct contact between the metallic surfaces of the electrode and the surfaces of the material is avoided. By means of the direct contact and rotary propulsion of the electrode, and the linear movement of the clamps 8, the material for treatment is transported through the treatment installation.

In addition to the insulating means 21, plastics insulating rings (not shown) may be disposed around the metallic structure, with or without a wear-resistant ceramic coating. Combinations of these insulating means are also possible.

The metal portions of the electrode are insoluble in the treatment agent. Special steel and titanium, with or without a coating of noble metals or their oxides, may be considered as such materials.

For supply of current, the electrode is provided electrical contact; it is sufficient to connect only the electrode tube and/or the metallic mesh to the current supply (not shown). With the exception of the current supply, the electrode tube and if necessary the metallic mesh over the electrode tube, all other parts of the electrode may be made from electrically non-conductive material. For current supply, the electrically conductive parts are electrically conductively connected to a slide ring 22. Sliding on the slide ring is a spring-loaded contact 23, which produces the connection via an electrical cable 24 for supply of current. The counter-pole of this current supply is connected by the cable 25 and sliding contacts (not shown) to the clamps 8, by means of which contact is established with the material for treatment. During electrolytic metallising, the material is incorporated as cathode, and the electrode as anode. During electrolytic etching, the material is the anode, and the electrode the cathode.

Normally, pieces of the material for treatment having differing thicknesses are processed. Therefore the space between the electrode surface and the counter-roller must be variable. The counter-roller is stationarily mounted, and adapted to the vertical position of the clamps 8. The same applies to electrodes disposed beneath the material for treatment. The receiving means 26 and the sliding bearing 27 may execute a small upward lifting movement against the pressure of springs. For this purpose the bearing 27 is secured against rotation in slot-shaped guides 28 and 29. The gearwheels 12 and 13 have a tooth configuration which permits this lifting movement without disengaging. The contact 23 also can execute this lifting movement against spring force. Finally, the connection 30 for the feed or return of treatment agent is of such a flexible construction that the lifting movement of the electrode is not prevented from compensating for the thickness of the material.

The counter-roller 10 is preferably made of a non-conductive material. It may however be made from a metal with a non-conductive covering 31. The covering 31 is preferably liquid-permeable, in order not to hinder penetration by the flow through the holes in the material for treatment. A profiling on the surface of the counter-roller acts in a similar way.

FIG. 2 shows an electrode in cross-section along the section line A–B of FIG. 1. It will be seen how the bearing 27 is non-rotatably secured in the guide 29 in order to compensate for the lifting movement. The area of highest current density between the electrode and the surface of the material lies on the surface line 32 of the electrode. To the right and left thereof, the current density decreases rapidly, due to the increase in the anode/cathode interval.

FIG. 3 shows a further embodiment, preferably for electrodes with large external diameters. In this case the electrolyte tube 33 is disposed eccentrically between the axis 34 and the electrode tube 35 in the area facing the material for treatment 5. The electrolyte tube is supported at points 37 towards the axis. The electrode tube slides on the bearing point 39 on the stationary bearing portion 38. At the bearing point 40, the axis is slidingly guided. The bearing portion is secured by pins 41 and secured against rotation. The electrolyte passes through openings 69.

The wall 42 contains slots. It permits the bearing shell 43 to execute a lifting movement to compensate for the thickness of the materials. The other constructional members correspond with those in FIG. 1. Therefore there will be no description of further details.

FIG. 4 shows the embodiment in FIG. 3 at the section C–D. The pins 41 are guided in the elongate slots 44, enabling the electrode to lift in order to compensate for the thickness of the material for treatment. The material is passed towards or away from the electrode by a movable tube 45. In the Figure, the tube is guided upwards, by way of example.

FIG. 5 shows a one-piece electrode. This consists only of an electrode tube 46 with the openings 47 provided over the entire circumference in the working area. The electrode tube is rotatably mounted in the bearing points 48 and 49. The stationary, yet vertically-movable connection 66 for the material opens into the rotating electrode tube 46. The treatment agent is introduced into, or extracted from, the electrode through the liquid-tight rotary coupling 50, 51; this rotary coupling also serves to seal off the guide means of the material for treatment from the exterior.

The treatment agent is prevented from flowing out in all directions from the openings distributed over the circumference of the electrode tube by a shell-shaped cover 52 attached above the electrode tube. A narrow gap is left free between the two parts in order to prevent the electrode from rubbing on the cover as it rotates. The cover is secured on the bearing part 53, and also executes its lifting movements in order to compensate for the differing thicknesses of the material for treatment. At a point aligned towards the treatment point, the cover 52 is open. In this way the treatment agent can be conveyed in a directed manner on to the treatment point on the surface of the material for treatment, or can be extracted therefrom by suction. This constructive solution may be used with particular advantage in the case of narrow working areas, i.e. in the case of short electrodes. The other constructive members have already been described with reference to FIG. 1.

FIG. 6 shows the arrangement shown in FIG. 5, in cross-section along the line E–F. The cover 52 prevents exit or entry of the treatment agent over the main portion of the circumference of the electrode. The smaller the gap 54, the more effective the flow of agent over the surface of the material.

FIGS. 7 to 10 show various arrangements of electrodes and counter-rollers along the transport track of the material for treatment in horizontal continuous-flow installations.

In general plate-shaped material for treatment, such for example as printed circuit boards, are to be treated in an identical manner on both sides. Therefore the arrangements on the upper and lower sides of the material are identical in structure. The arrows in the drawing show the flow direction of the treatment agent. The extended arrows 55 apply to flow electrodes from which the treatment agent is conveyed on to the surface of the material and the holes therein; the 'hollow' arrows 56 apply to suction electrodes by means of which the treatment agent is extracted by suction from the surfaces of the material, so that a flow of treatment agent arises to the treatment point between the electrode and the surface of the material for treatment.

In FIG. 7, the electrodes 9 and their counter-rollers 10 are disposed to lie precisely opposite one another. The electrodes maintain a fixed interval relative to the surface of the material. In this case it is unnecessary for these and the lower counter-rollers to execute a lifting movement. The lifting movement to compensate for the thickness of the material is, however, provided for the upper counter-rollers. It is appropriate if the counter-rollers are provided with a liquid-permeable surface 57. In FIG. 8, the counter-rollers are offset to the electrodes rolling along the material for treatment in such a way that, in the area 58 at the contact point between the electrode and the surface of the material, treatment agent can flow unhindered out of the electrode or into it. This offsetting also reinforces the penetration of the holes. Therefore a liquid-permeable surface of the counter-rollers can be omitted here.

In the arrangement according to FIG. 9, the area 58 is kept free by the use of two counter-rollers 10 for each electrode 9. This arrangement has the advantage that thin treatment agent, such for example as conductor films, may be efficiently passed through the treatment installation.

In the arrangement shown in FIG. 10, no counter-rollers are provided. In order to provide better penetration of the holes, a flow electrode and a suction electrode in each case are disposed opposite one another. On one side, flow and suction electrodes alternate along the transport track. This arrangement permits an extremely close sequence of electrodes, so that the treatment installation can be kept extremely short.

If the method according to the invention of electrolytically etching, for example, metallic surfaces, the metal removed from the material for treatment is deposited on the metal parts, connected to the current supply, of the electrodes. It must be continuously or intermittently removed from these points.

FIG. 11 shows an electrical circuit arrangement suitable for this purpose. The numerals 59 and 60 indicate the current supply for the etching process on the upper and lower sides of the material for treatment 5. The electrodes 9 are provided with electrical contact by the carbon brushes 61 and slide rings 22.

Further sources of current supply 62 and 63 serve to remove the metal deposited on the electrodes, and to deposit it on the auxiliary cathodes 64 and 65, which if necessary can be exchanged. Provision of electrical contact between the sources of current 62 and 63 and the electrodes is effected by the same contacts as those of the current supply 59 and 60.

The supplementary supply of electrolyte solution with the metal ions to be separated during electrolytic metallisation with insoluble anodes is undertaken according to known methods inside or outside the electrolytic cell.

I claim:

1. The method for electrolytically metallizing or etching perforated printed circuit boards having holes therein with a selected current density, comprising the steps of:
    (a) bringing printed circuit boards and at least one partly hollow electrode, with surface openings therein, into contact with a treatment agent;
    (b) polarizing the at least one electrode electrically relative to the printed circuit boards;
    (c) moving the printed circuit boards in a linear path of travel at a preset speed;
    (d) moving the at least one electrode in a rotating fashion with its periphery at a tangential speed equal to said predetermined speed;
    (e) supplying the treatment agent through the at least one partly hollow electrode;
    (f) wherein the step of supplying treatment agent includes passing the treatment agent under relative pressure through the openings in the at least one electrode while printed circuit boards are moved opposite the openings, so that the direction of flow of the treatment agent is only transverse to the path of travel of the printed circuit boards relative to holes of the printed circuit boards; and
    (g) wherein the step of passing the treatment agent through the at least one electrode includes suctioning the treatment agent through the at least one electrode.

2. The method of claim 1, wherein the step of passing the treatment agent through the at least one electrode includes delivering the treatment agent under positive pressure to the printed circuit boards via the openings in at least one electrode.

3. The method according to any one of claim 1 or 2, including the step of providing the at least one electrode with a treatment-agent-permeable insulating covering at its periphery, and wherein the insulating covering is brought into direct contact, at a contact location, with the printed circuit boards being treated, and wherein the speed of the insulating covering on the least one electrode and the speed of the printed circuit boards at the contact location, are essentially the same.

4. The method according to any one of claim 1 or 2, including the step of gripping the printed circuit boards and holding them in a substantially horizontal orientation and transporting the printed circuit boards along the path of travel in a substantially horizontal direction.

5. A method according to any one of claim 1 or 2, wherein the step of supplying a treatment agent comprises supplying the printed circuit boards with a metallizing solution as the treatment agent, wherein there are provided a plurality of electrodes, wherein the plurality of electrodes are disposed one behind the other along the path of travel of printed circuit boards, wherein the printed circuit boards are moved past the plurality of electrodes, wherein the electrodes are alternately polarized as anode or cathode with respect to the printed circuit boards, and wherein the printed circuit boards in their movement along their path of travel past the electrodes are respectively metallized and partly demetallized.

6. The method according to claim 1, wherein there are a plurality of electrodes provided, at least one on each side of the path of travel of printed circuit boards, and wherein treatment agent emerges though holes in the printed circuit boards in a forced manner by means of positive pressure treatment agent flow from at least one electrode on one side of the path of travel of printed circuit boards, and wherein treatment agent is extracted by suction through openings in at least one suction electrode situated on the opposite side of the path of travel of printed circuit boards.

7. An apparatus for electrolytically metallizing or etching perforated printed circuit boards provided with holes, comprising:
(a) at least one hollow electrode adapted to be polarized as anode or cathode relative to the printed circuit boards;
(b) a power supply for the at least one electrode and the printed circuit boards;
(c) means for rotationally moving the at least one electrode;
(d) means for supplying treatment agent to one of
(i) the hollow at least one electrode with further means for discharging treatment agent from the at least one electrode to the openings in the printed circuit boards; and
(ii) the surfaces of the printed circuit boards with further means for extracting the treatment agent by suction from the printed circuit boards through openings in the at least one electrode;
(e) means for moving the printed circuit boards and the at least one electrode in a linear path of travel while the at least one electrode is moved rotationally, with said movements of said at least one electrode and printed circuit boards being synchronous to each other; and
(f) storage container means for the treatment agent;
(g) wherein the at least one electrode is generally cylindrically configured and disposed along the path of travel of the printed circuit boards and in transverse relation thereto, and with the at least one electrode having openings therein and including a flexible treatment agent flow line connected to the at least one electrode, and with a cover enveloping the at least one electrode; said cover having a treatment agent passage open only towards the path of travel of the printed circuit boards.

8. The apparatus according to claim 7, characterized in that the at least one electrode has an insulation means that is disposed for having direct contact with printed circuit boards moving therepast along their path of travel.

9. An apparatus according to one of claims 7 and 8, characterized in that the at least one electrode carries a non-rotatable electrolyte tube situated in the at least one electrode, with electrolyte passway means disposed to face a surface of a printed circuit board.

10. An apparatus according to one of claim 7 or 8, characterized by an at least one electrode situated on one side of the path of travel of printed circuit boards and one of:
(i) a further at least one electrode; and
(ii) a counter-roller;
situated on the other side of the path of travel of the printed circuit boards.

11. An apparatus according to one of claims 7 and 8, characterized by a sleeve enveloping the at least one electrode on all sides and in firm contact therewith; said sleeve being one of:
(i) a metallic construction;
(ii) a textile fabric construction; and
(iii) a screen construction.

12. An apparatus according to one of claims 7 and 8, characterized in that the at least one electrode comprises a flow electrode, with means for conveying the treatment agent through the holes in the printed circuit boards on one side of the path of travel of printed circuit boards; with at least one suction electrode disposed directly opposite the at least one flow electrode, into which the treatment agent passing through the holes of the printed circuit boards is sucked, on the other side of the path of travel of printed circuit boards.

13. An apparatus according to claim 7, characterized by liquid-and-ion-permeable, electrically non-conductive means carried on the exterior of the at least one electrode.

14. An apparatus for electrolytically metallizing or etching perforated printed circuit boards provided with holes, comprising:
(a) at least one hollow electrode adapted to be polarized as anode or cathode relative to the printed circuit boards;
(b) a power supply for the at least one electrode and the printed circuit boards;
(c) means for rotationally moving the at least one electrode;
(d) means for supplying treatment agent to one of
(i) the hollow at least one electrode with further means for discharging treatment agent from the at least one electrode to the openings in the printed circuit boards; and
(ii) the surfaces of the printed circuit boards with further means for extracting the treatment agent by suction from the printed circuit boards through openings in the at least one electrode;
(e) means for moving the printed circuit boards and the at least one electrode in a linear path of travel while the at least one electrode is moved rotationally, with said movements of said at least one electrode and printed circuit boards being synchronous to each other; and
(f) storage container means for the treatment agent; and
(g) wherein the at least one electrode carries a non-rotatable electrolyte tube situated in the at least one electrode, with electrolyte passway means disposed to face a surface of a printed circuit board.

15. The apparatus according to claim 14, characterized in that the at least one electrode has an insulation means that is disposed for having direct contact with printed circuit boards moving therepast along their path of travel.

16. An apparatus according to any one of claim 14 or 15, characterized by a sleeve enveloping the at least one electrode on all sides and in firm contact therewith; said sleeve being one of:
(i) a metallic construction;
(ii) a textile fabric construction; and
(iii) a screen construction.

17. An apparatus according to any one of claim 14 or 15, characterized by an at least one electrode situated an one side or the path of travel of printed circuit boards and one of:

(i) a further at least one electrode; and
(ii) a counter-roller;
situated on the other side of the path of travel of the printed circuit boards.

18. An apparatus according to any one of claim 14 or 15, characterized in that the at least one electrode comprises a flow electrode, with means for conveying the treatment agent through the holes in the printed circuit boards on one side of the path of travel of printed circuit boards; with at least one suction electrode disposed directly opposite the at least one flow electrode, into which the treatment agent passing through the holes of the printed circuit boards is sucked, on the other side of the path of travel of printed circuit boards.

19. The apparatus according to claim 14, characterized in that the at least one electrode is generally cylindrically configured and disposed along the path of travel of the printed circuit boards, and with the at least one electrode having openings therein and including a flexible treatment agent flow line connected to the at least one electrode, and with a cover enveloping the at least one electrode; said cover having a treatment agent passage open only towards the path of travel of the printed circuit boards.

20. An apparatus according to claim 14, characterized by liquid-and-ion-permeable, electrically non-conductive means carried on the exterior of the at least one electrode.

21. An apparatus for electrolytically metallizing or etching perforated printed circuit boards provided with holes, comprising:
(a) at least one hollow electrode adapted to be polarized as anode or cathode relative to the printed circuit boards;
(b) a power supply for the at least one electrode and the printed circuit boards;
(c) means for rotationally moving the at least one electrode;
(d) means for supplying treatment agent to one of
  (i) the hollow at least one electrode with further means for discharging treatment agent from the at least one electrode to the openings in the printed circuit boards; and
  (ii) the surfaces of the printed circuit boards with further means for extracting the treatment agent by suction from the printed circuit boards through openings in the at least one electrode;
(e) means for moving the printed circuit boards and the at least one electrode in a linear path of travel while the at least one electrode is moved rotationally, with said movements of said at least one electrode and printed circuit boards being synchronous to each other; and
(f) storage container means for the treatment agent; and
(g) wherein the at least one electrode comprises a flow electrode, with means for conveying the treatment agent through the holes in the printed circuit boards on one side of the pad of travel of printed circuit boards; with at least one suction electrode disposed directly opposite the at least one flow electrode, into which the treatment agent passing through the holes of the printed circuit boards is sucked, on the other side of the path of travel of printed circuit boards.

22. The apparatus according to claim 21, characterized in that the at least one electrode has an insulation means that is disposed for having direct contact with printed circuit boards moving therepast along their path of travel.

23. The method for electrolytically metallizing or etching perforated printed circuit boards having holes therein with a selected current density, comprising the steps of:

(a) bringing printed circuit boards and at least one partly hollow electrode, with surface openings therein, into contact with a treatment agent;
(b) polarizing the at least one electrode electrically relative to the printed circuit boards;
(c) moving the printed circuit boards in a linear path of travel at a preset speed;
(d) moving the at least one electrode in a rotating fashion with its periphery at a tangential speed equal to said predetermined speed;
(e) supplying the treatment agent through the at least one partly hollow electrode; and
(f) wherein the step of supplying treatment agent includes passing the treatment agent under relative pressure through the openings in the at least one electrode while printed circuit boards are moved opposite the openings, so that the direction of flow of the treatment agent is only transverse to the path of travel of the printed circuit boards relative to holes of the printed circuit boards;
(g) wherein there are a plurality of electrodes provided, at least one on each side of the path of travel of printed circuit boards, and wherein treatment agent emerges though holes in the printed circuit boards in a forced manner by means of positive pressure treatment agent flow from at least one electrode on one side of the path of travel of printed circuit boards, and wherein treatment agent is extracted by suction through openings in at least one suction electrode situated on the opposite side of the path of travel of printed circuit boards.

24. The method according to claim 23, wherein the step of passing the treatment agent through the at least one electrode includes suctioning the treatment agent through the at least one electrode.

25. The method of claim 23, wherein the step of passing the treatment agent through the at least one electrode includes delivering the treatment agent under positive pressure to the printed circuit boards via the openings in at least one electrode.

26. The method according to any one of claims 23–25, including the step of providing the at least one electrode with a treatment-agent-permeable insulating covering at its periphery, and wherein the insulating covering is brought into direct contact, at a contact location, with the printed circuit boards being treated, and wherein the speed of the insulating covering on the least one electrode and the speed of the printed circuit boards at the contact location, are essentially the same.

27. The method according to any one of claims 23–25, including the step of gripping the printed circuit boards and holding them in a substantially horizontal orientation and transporting the printed circuit boards along the path of travel in a substantially horizontal direction.

28. A method according to any one of claims 23–25, wherein the step of supplying a treatment agent comprises supplying the printed circuit boards with a metallising solution as the treatment agent, wherein there are provided a plurality of electrodes, wherein the plurality of electrodes are disposed one behind the other along the path of travel of printed circuit boards, wherein the printed circuit boards are moved past the plurality of electrodes, wherein the electrodes are alternately polarized as anode or cathode with respect to the printed circuit boards, and wherein the printed circuit boards in their movement along their path of travel past the electrodes are respectively metallized and partly demetallized.

29. The method for electrolytically metallizing or etching perforated printed circuit boards having holes therein with a selected current density, comprising the steps of:
  (a) bringing printed circuit boards and at least one partly hollow electrode, with surface openings therein, into contact with a treatment agent;
  (b) polarizing the at least one electrode electrically relative to the printed circuit boards;
  (c) moving the printed circuit boards in a linear path of travel at a preset speed;
  (d) moving the at least one electrode in a rotating fashion with its periphery at a tangential speed equal to said predetermined speed;
  (e) supplying the treatment agent through the at least one partly hollow electrode; and
  (f) wherein the step of supplying treatment agent includes passing the treatment agent under relative pressure through the openings in the at least one electrode while printed circuit boards are moved opposite the openings, so that the direction of flow of the treatment agent is only transverse to the path of travel of the printed circuit boards relative to holes of the printed circuit boards;
  (g) wherein the step of supplying a treatment agent comprises supplying the printed circuit boards with a metallizing solution as the treatment agent, wherein there are provided a plurality of electrodes, wherein the plurality of electrodes are disposed one behind the other along the path of travel of printed circuit boards, wherein the printed circuit boards are moved past the plurality of electrodes, wherein the electrodes are alternately polarized as anode or cathode with respect to the printed circuit boards, and wherein the printed circuit boards in their movement along their path of travel past the electrodes are respectively metallized and partly demetallized.

30. The method according to claim 29, wherein the step of passing the treatment agent through the at least one electrode includes suctioning the treatment agent through the at least one electrode.

31. The method of claim 29, wherein the step of passing the treatment agent through the at least one electrode includes delivering the treatment agent under positive pressure to the printed circuit boards via the openings in at least one electrode.

32. The method according to any one of claims 29–31, including the step of providing the at least one electrode with a treatment-agent-permeable insulating covering at its periphery, and wherein the insulating covering is brought into direct contact, at a contact location, with the printed circuit boards being treated, and wherein the speed of the insulating covering on the least one electrode and the speed of the printed circuit boards at the contact location, are essentially the same.

33. The method according to any one of claims 29–31, including the step of gripping the printed circuit boards and holding them in a substantially horizontal orientation and transporting the printed circuit boards along the path of travel in a substantially horizontal direction.

34. The method according to claim 29, wherein there are a plurality of electrodes provided, at least one on each side of the path of travel of printed circuit boards, and wherein treatment agent emerges though holes in the printed circuit boards in a forced manner by means of positive pressure treatment agent flow from at least one electrode on one side of the path of travel of printed circuit boards, and wherein treatment agent is extracted by suction through openings in at least one suction electrode situated on the opposite side of the path of travel of printed circuit boards.

* * * * *

UNITED STATES PATENT AND TRADEMARK OFFICE
CERTIFICATE OF CORRECTION

PATENT NO. : 6,176,995 B1  
DATED : January 23, 2001  
INVENTOR(S) : Reinhard Schneider Page 1 of 1

It is certified that error appears in the above-identified patent and that said Letters Patent is hereby corrected as shown below:

Column 1,  
Line 25, delete "flesh" and insert -- fresh --.  
Line 66, delete "solution" and insert -- solutions --.

Column 9,  
Line 12, delete "is" and insert -- if --.  
Line 13, delete "if" and insert -- is --.

Column 14,  
Line 66, delete "an" and insert -- on --.

Signed and Sealed this

Nineteenth Day of February, 2002

Attest:

JAMES E. ROGAN  
*Director of the United States Patent and Trademark Office*

*Attesting Officer*